US005193047A

United States Patent [19]

Barratt et al.

[11] Patent Number: 5,193,047

[45] Date of Patent: Mar. 9, 1993

[54] PROTECTION OF ELECTRONIC CIRCUITS

[75] Inventors: Stephen C. Barratt, Hornchurch; Brian W. Grant, Chelmsford, both of United Kingdom

[73] Assignee: Alcatel Business Systems Limited, Romford, United Kingdom

[21] Appl. No.: 428,980

[22] Filed: Oct. 30, 1989

[30] Foreign Application Priority Data

Nov. 1, 1988 [GB] United Kingdom .................. 825534

[51] Int. Cl.[5] .............................................. H05K 9/00

[52] U.S. Cl. .................................... 361/212; 364/708

[58] Field of Search ............... 361/212, 220; 200/5 A, 200/304, 305, 512, 513, 514; 235/101; 364/464.02, 708; 379/437, 451; 340/711

[56] References Cited

U.S. PATENT DOCUMENTS

| | | | |
|---|---|---|---|
| 4,336,529 | 6/1982 | Buan | 200/305 X |
| 4,494,651 | 1/1985 | Malcolm | 206/328 |
| 4,540,865 | 9/1985 | Calder | 200/340 |
| 4,764,770 | 8/1988 | Church | 340/365 R |
| 4,809,126 | 2/1989 | Burkman et al. | 361/212 |
| 4,814,566 | 3/1989 | Sigl | 200/305 |
| 4,818,829 | 4/1989 | Nopper et al. | 200/512 |

FOREIGN PATENT DOCUMENTS 3634658 4/1988 Fed. Rep. of Germany .

*Primary Examiner*—A. D. Pellinen
*Assistant Examiner*—David Osborn
*Attorney, Agent, or Firm*—Shoemaker and Mattare, Ltd.

[57] ABSTRACT

Protection of electronic circuits from static electrical discharge is provided by utilizing a key mat, having key buttons moulded therein, of a key board for the circuits to provide an electrically insulating barrier to such discharges. The electronic circuits are housed in a housing having apertures through which the key buttons extend. Electrical discharge from a key button through the aperture in the housing to the circuits is prevented by forming the mat to have an extent sufficient to ensure that any discharge track is longer than that for a predetermined potential. Where the direct distance to a circuit is short the mat is formed so as to ensure a discharge track greater than the direct distance and of sufficient length. For this purpose the mat may be formed with an upstanding wall. A housing may have a cooperating wall to lengthen the air path.

5 Claims, 1 Drawing Sheet

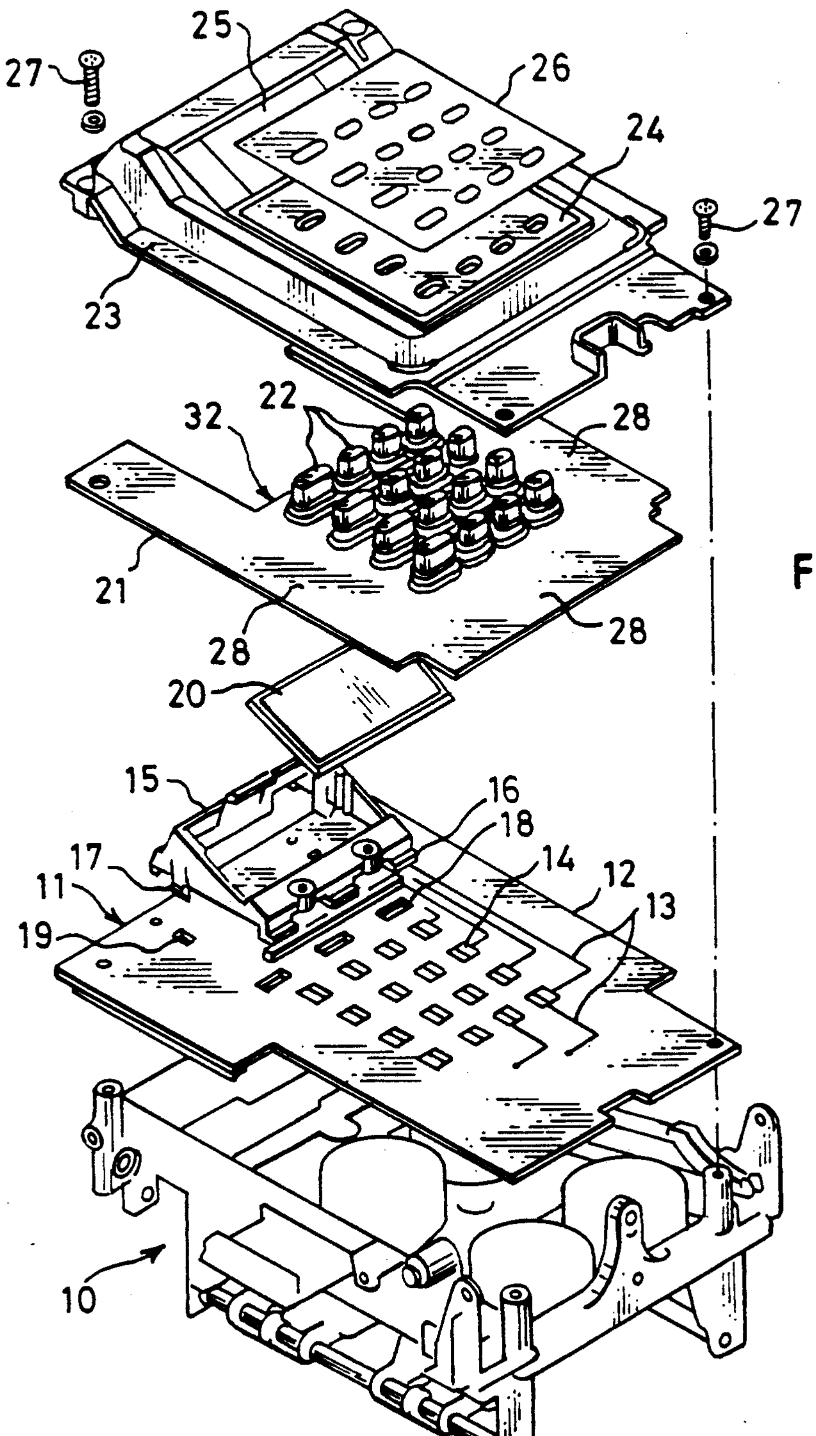
FIG.1.
FIG.2.
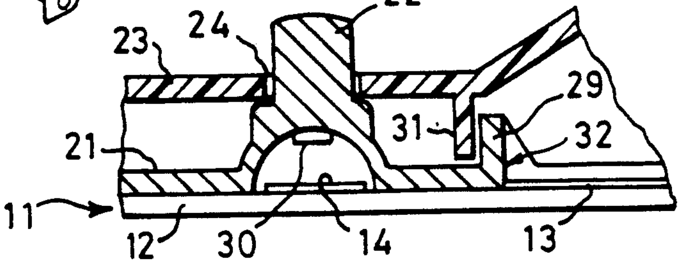

PROTECTION OF ELECTRONIC CIRCUITS

BACKGROUND OF THE INVENTION

This invention relates to the protection of electronic circuits from undesired effects due to static electrical discharges and in particular to the protection of the electronic circuits of postal franking meters.

Static electrical charge is often generated in modern office environments due to the low humidity levels maintained by air conditioning and frictional engagement between carpets and the shoes of personnel working in the office. Consequently, when personnel use equipment incorporating electronic circuits, static electricity is often discharged to the equipment. In some electronic equipment such discharges may result merely in momentary mal-function of the circuits with no long term ill effects. However in other electronic equipment, such as equipment carrying out data processing functions, a momentary mal-function may result in corruption of data being stored or processed with the result that subsequent operation of the equipment would be affected by such corruption of the data. Corruption of data is of particular concern in connection with equipment such as postal franking meters in which electronic circuits carry out accounting functions related to usage of the meter for franking mail items and are required to maintain reliably accurate accounting records. The records typically include the accumulated value used in franking mail items and the value of credit remaining available for use in further franking operations. Since these accounting records provide the basis on which the user is charged for usage of the meter and on which the postal authority receives revenue for postage it is very important to ensure that these possible discharges of static electricity do not result in mal-functioning of the electronic circuits of the postal franking meter.

While protection from static electricity discharges can be provided in some equipment by housing the equipment in a casing which is electrically conductive or has an electrically conductive layer entirely surrounding the circuitry, difficulties arise in using this form of protection with equipment which is required to provide interfaces such as a digital display and a keyboard between the equipment and a user. The display requires the provision of a transparent window in order that it can be viewed by the user and the keyboard requires the provision of an aperture or apertures in the casing through which the keys project.

SUMMARY OF THE INVENTION

According to one aspect of the invention electronic apparatus includes a printed circuit board carrying on a face thereof electronic circuits and switch contact pads and a mat of electrically insulating material having moulded therein an array of key buttons each having an electrically conductive contact movable into electrical contact with a corresponding switch contact pad wherein the mat of electrically insulating material provides a continuous layer of electrically insulating material extending over substantially the entire face of the printed circuit board effective to prevent tracking of static electrical discharge of potential up to a predetermined magnitude to the electrical circuit.

Preferably the printed circuit board and the mat of electrically insulating material are housed within a housing and the key buttons project through apertures in the housing.

The electronic apparatus may include a display panel mounted on the printed circuit board and projecting from the face thereof and the mat of electrically insulating material extends away from the face of the printed circuit board to or toward the display panel.

Preferably the display panel is located within the housing and the housing includes a transparent window to enable viewing of the display panel and wherein the transparent window is sealed to the housing in such a manner as to substantially preclude any air-gap between the window and the housing.

The electronic apparatus hereinbefore defined may be part of a postal franking meter.

Another aspect of the invention envisages a method of protecting electronic circuits from static electrical discharge, said circuits including a printed circuit board carrying electronic components and having on a face thereof electrically conductive tracks interconnecting said components and contact pads and a mat of resilient electrically insulating material having key buttons moulded thereon, said key buttons including electrically conductive contacts effective to make electrical contact with said contact pads upon manual depression of the key buttons, the method comprising the step of forming the electrically insulating mat to extend over substantially the entire surface of the face of the printed circuit board.

The method may be utilised to protect electronic circuits of a postal franking meter.

BRIEF DESCRIPTION OF THE DRAWING

An embodiment of the invention will now be described by way of example with reference to the drawings in which:

FIG. 1 is an exploded view of a postal franking meter having a keyboard mat and FIG. 2 is a sectional view of a part of an assembled keyboard.

DESCRIPTION OF THE PREFERRED EMBODIMENT

Referring to the drawing, a mechanical sub-assembly 10 incorporates mechanisms for setting print elements of the franking meter to enable selected values of franking to be printed on mail items. The construction of such an assembly is well known in the franking machine art and does not form any part of the present invention. Accordingly it is believed to be un-necessary to describe the assembly in detail. Secured to the sub-assembly 10 is a printed circuit board 11 comprising an electrically insulating substrate 12 having upper and lower surfaces on which patterns of electrically conductive tracks are deposited. The electrically conductive pattern 13 deposited on the upper face of the substrate includes an array of pairs of switch contact pads 14. It will be appreciated that for clarity the conductive tracks of the pattern 13 shown in the drawing are merely exemplary and that in practice the pattern would consist of a larger number of conductive tracks and would be more complex. The conductive patterns on the upper and lower faces of the substrate are interconnected by conductive connections extending through the thickness of the substrate 12 and electronic components, such as integrated circuit components are mounted on the lower face of the substrate and electrically connected to the conductive patterns to form electronic circuits for carrying out accounting and control functions for the postal franking meter. The particular arrangement and interconnection of the components is not relevant to the present invention and accordingly it is believed to be un-necessary to describe the construction and operation of the electronic circuits. A mounting 15, comprising a moulding of electrically insulating plastics material, is secured to the substrate 12 of the printed circuit board by means of projections 16, 17 which engage respectively in slots 18, 19 in the substrate. When the mounting 15 is secured to the substrate, firstly the projections 16 are engaged in the slots 18 and then the projections 17, which are resilient and of barb-like form are urged into the slots 19 to retain the mounting on the substrate. A liquid crystal display panel 20 is held by the mounting 15 such that it is tilted relative to the plane of the substrate. Electrical connections, not shown, are provided between the display panel 20 and the electronic circuits formed on the printed circuit board 11.

A mat 21 having an array of key buttons 22 moulded therein is laid over the upper face of the printed circuit board. The mat is formed of electrically insulating material which is relatively easily deformable to permit the key buttons to be depressed by manual operation thereof. The interior of each key button is provided with an electrically conductive contact pill 30 (see FIG. 2). The key buttons and pairs of switch contact pads 14 are so positioned relative to one another that for each pair of contact pads the contact pill 30 of the corresponding key button is aligned to lie over the contact pads 14 of a pair such that, when the key button is depressed by manual operation thereof, the contact pill bridges between the contact pads of the pair so as to electrically connect the pair of contact pads. An outer face panel 23, comprising a plastics moulding, extends over the mat 21 and the liquid crystal display panel 20. The panel has apertures 24 through which the key buttons 22 extend and is provided with a transparent window 25 to enable viewing of data displayed by the display panel. An overlay sheet 26 may be secured to the face panel on which indications of the functions of the key buttons are provided. The face panel 23 and the printed circuit board 11 are secured to the mechanical sub-assembly 10, with the mat 21 sandwiched therebetween, by means of screws 27 and this assembly is then housed in a housing (not shown) which is preferably formed as a moulding of plastics material with an electrically conductive layer on its inner surface. The face panel 23 forms the upper wall of the housing.

Usually in electronic apparatus using an array of key buttons formed in a mat of resilient material, the mat has an extent which is merely large enough to accommodate the area required for the array of key buttons. With a mat of such limited extent any static electrical discharge from a user touching the key buttons is able to track along a relatively short path from any of the key buttons through the corresponding aperture 24 to the electrically conductive pattern on the upper face of the printed circuit board. While the face panel 23 can be secured to the remainder of the housing for the machine in a manner, for example by ensuring a sufficiently wide overlap, which prevents static discharge to the electronic circuits within the housing, the apertures in the face cover which are necessary for the key buttons 22 can enable static discharge to occur from the exterior of the housing to the interior thereof. However in accordance with the present invention, the mat is formed to have an extent such as to extend over substantially the entire area of the printed circuit board. Thus the mat 21 comprises not only the area of the array of key buttons but also an additional marginal area 28 extending to the edges of the printed circuit board. Accordingly the mat 21 provides a continuous insulating layer over substantially the entire upper face of the printed circuit board and as a result any discharge track extending from any of the key buttons through the apertures 24 and between the mat and the face panel 23 to a conductive track on the printed circuit board is so long that discharges of static electricity of relatively high potential to the electronic circuits are prevented. The dimensions of the mat and in particular the additional marginal area have been chosen such that, based on a value of 1 KV/mm, the length of any possible discharge track is not less than that which is able to withstand the value of static potential for which protection is required. Using the basis of 1 KV/mm provides a margin of tolerance sufficient to take account of deleterious effects due to the possible presence of foreign particles in the space between the mat and the face cover. The degree of protection required may differ for different applications. In relation to certain items of electronic equipment the authorities in some countries specify a minimum discharge potential which the equipment is required to withstand. This minimum potential may be of the order of 15 KV or for example in relation to franking machines for use in the United Kingdom the minimum potential is 21 KV. Postal meters provided with a key mat extending over the printed circuit board as hereinbefore described have withstood test discharges in excess of 21 KV.

When the window 25 is formed separately from the face panel and is secured to the face panel, air gaps may extend between the window and the face panel which would allow a relatively short track for electrical discharge from the exterior of the panel to the liquid crystal display and thence to the other parts of the electronic circuits. Accordingly it is necessary to ensure that the window is secured to the face panel, for example by adhesive, in such manner that there is a continuous unbroken seal between the edge of the window and the panel so that there are no air gaps through which an electrical discharge could track.

It will be appreciated that, with the juxta-position of the array of key buttons and the display panel as shown in the drawing, the length of discharge track from the row of key buttons nearest the display panel to that portion of the printed circuit board lying below the display panel would be shorter than any discharge track extending across the marginal portions 28 of the mat 21 to the underlying printed circuit board. If as a result the degree of protection provided against static electrical discharges is insufficient the length of track from this row of keys is extended by moulding the mat 21 adjacent edge 32 intermediate the keys 22 and the display panel 20 such that the marginal portion 28 extends, as shown in FIG. 2 as a wall 29, upwardly from the general plane of the mat around the mounting 15 as far as, or toward, the display panel 20. The face panel 23 is formed with a rib 31 projecting from its lower surface (FIG. 2) toward the mat and extending between the wall 29 and the row of key buttons 22 nearest the wall 29. Accordingly the shortest tracking path from the key button 22 to the conductive tracks 13 on substrate 12 of the printed circuit board 11 extends from the key button through the aperture 24 down to the free edge of the rib 31, then between the rib 31 and the wall 29 across the top of the wall and down to the conductive tracks 13. Thus the wall 29 and the rib 31 are effective to ensure that the length of any tracking path from the key buttons 22 to the conductive tracks 13 is greater than the direct distance to the edge of the mat. The length of any possible discharge track is dependent upon the height of the wall and this can be formed to be sufficient to provide the required degree of protection against static discharge. In FIG. 2 the wall 29 and the rib 31 are shown spaced apart. However if desired the wall may extend in contact with the rib.

We claim:

1. Electronic apparatus including a printed circuit board carrying on a face thereof electronic circuits and an array of switch contact pads; a face panel extending over and spaced from said printed circuit board and having an array of apertures therein; a mat of electrically insulating deformable material including an array of key buttons moulded in said mat, said key buttons being provided with electrically conductive contacts and extending through corresponding apertures in said face panel; said mat including an integral marginal portion extending outwardly from said array of key buttons; said mat extending over said face of said printed circuit board between said printed circuit board and said face panel with an air space between said face panel and said mat; said electrically conductive contacts being located opposite corresponding switch contact pads and movable into electrical contact with said corresponding switch contact pads by manual operation of the key buttons; said mat of electrically insulating material providing a continuous layer of electrically insulating material extending over substantially the whole of said face of said printed circuit board; wherein said marginal portion includes a wall extending away from the face of the printed circuit board and said face panel includes a rib extending toward the mat between said wall and said array of key buttons such that a static discharge track from the key buttons through said air space to the circuits on the circuit board is constrained to extend between the wall and the rib.

2. Electronic apparatus including:

a printed circuit board carrying electronic circuits; a mat of deformable electrically insulating material extending over said printed circuit board;

an array of key buttons moulded in said mat and a corresponding array of switch contact sets on said printed circuit board;

each key button carrying a contact member for co-operation with a corresponding one of said switch contacts sets;

and wherein for preventing electro-static discharge to said electronic circuits:

the keyboard is housed in a housing, said housing including a wall having a plurality of apertures corresponding respectively to said plurality of key buttons and said key buttons projecting to the exterior of the housing through said apertures;

said mat includes an integral marginal area of electrically insulating material extending outwardly from said array of key buttons over said printed circuit board;

said mat further includes a first rib extending away from said printed circuit board, said first rib having a free edge spaced from said printed circuit board and said wall includes a second rib extending adjacent said first rib toward said mat beyond said free edge of said first rib;

said mat and said first rib defining with said wall and said second rib an air space extending from the exterior of said housing through said apertures and between said wall and said mat through which electro-static discharge from the key buttons to said electronic circuits could occur;

the extent of said mat and the extent of said first and second ribs being effective to ensure that any track through said air space along which electro-static discharge could occur from any of said key buttons to said electronic circuits on said printed circuit board is of sufficient length as to prevent the occurrence of electrostatic discharge through said air space up to a predetermined potential.

3. Electronic apparatus as claimed in claim 2 including a display device mounted on said printed circuit board in juxta-position to said array of switch contact sets; and wherein the first rib and the second rib are located between said display device and said array of key buttons and are effective to ensure that any track for electro-static discharge through the air space from said key buttons to said display device is of sufficient length as to prevent ocurrence of electro-static discharge up to a predetermined potential.

4. Electronic apparatus as claimed in claim 3 wherein the wall has an opening to enable viewing of said display device from the exterior of the housing and including a window panel of optically transparent electrically insulating material extending across said opening and secured to said wall in sealing engagement therewith to preclude formation of any air gap between said window panel and said wall through which electro-static discharge could occur.

5. In a franking machine:

a printed circuit board carrying electronic circuits;

a mat of deformable electrically insulating material extending over said printed circuit board;

an array of key buttons moulded in said mat and a corresponding array of switch contact sets on said printed circuit board;

each key button carrying a contact member for co-operation with a corresponding one of said switch contact sets;

and wherein for preventing electro-static discharge to said electronic circuits:

the keyboard is housed in a housing, said housing including a wall having a plurality of apertures corresponding respectively to said plurality of key buttons and said key buttons projecting to the exterior of the housing through said apertures;

an electronic display device mounted on said printed circuit board in juxta-position to said array of switch contact sets;

said mat includes an integral marginal area of electrically insulating material extending outwardly from said array of key buttons over the printed circuit board;

said mat further includes a first rib extending away from said printed circuit board, said first rib extending between said display device and said array of key buttons and having a free edge spaced from said printed circuit board and said wall includes a second rib extending between the display device and the key buttons adjacent said first rib toward said mat beyond said free edge of said first rib;

said mat and said first rib defining with said housing and said second rib an air space through which electro-static discharge from said key buttons to said electronic circuits and said display could occur;

the extent of said mat and the extent of said first and second ribs being effective to ensure that any track through said air space along which said electro-static discharge could occur from any of said key buttons to said electronic circuits and display device on said printed circuit board is of sufficient length as to prevent the occurrence of said electro-static discharge up to a predetermined potential to the printed circuit board.

* * * * *